United States Patent [19]

Katz

[11] Patent Number: 4,965,530

[45] Date of Patent: Oct. 23, 1990

[54] PARALLELLED AMPLIFIER WITH SWITCHED ISOLATION RESISTORS

[75] Inventor: Allen Katz, West Windsor Township, Mercer County, N.J.

[73] Assignee: General Electric Company, East Windsor, N.J.

[21] Appl. No.: 413,553

[22] Filed: Sep. 26, 1989

[51] Int. Cl.[5] ............................................. H03F 3/68
[52] U.S. Cl. ..................................... 330/295; 330/286
[58] Field of Search ...................... 330/51, 53, 54, 84, 330/124 D, 124 R, 286, 295; 333/26, 101, 136

[56] References Cited

U.S. PATENT DOCUMENTS

| | | | |
|---|---|---|---|
| 2,331,363 | 10/1943 | Washburn | 330/124 R |
| 3,032,723 | 5/1962 | Ring | 333/101 |
| 3,250,860 | 5/1966 | Vincent et al. | 333/101 |
| 3,519,961 | 7/1970 | Bergey | 333/101 |
| 3,568,096 | 3/1971 | Kordos | 333/84 |
| 3,654,566 | 4/1972 | Wellhausen et al. | 330/124 R |
| 3,733,560 | 5/1973 | Oltman, Jr. et al. | 330/56 |
| 3,783,401 | 1/1974 | Oltman, Jr. | 330/56 |
| 3,873,934 | 3/1975 | Oltman, Jr. et al. | 330/56 |
| 3,873,935 | 3/1975 | Oltman, Jr. | 330/56 |
| 3,958,247 | 5/1976 | Bogner et al. | 343/754 |
| 4,263,568 | 4/1981 | Nemit | 333/127 |
| 4,282,491 | 8/1981 | McMaster et al. | 330/286 |
| 4,285,346 | 8/1981 | Armitage | 128/422 |
| 4,291,278 | 9/1981 | Quine | 330/286 |
| 4,315,222 | 2/1982 | Saleh | 330/124 D |
| 4,424,496 | 1/1984 | Nichols et al. | 330/286 |
| 4,472,691 | 9/1984 | Kumar et al. | 333/136 X |
| 4,641,106 | 2/1987 | Belohoubek et al. | 330/286 |
| 4,641,107 | 2/1987 | Kalokitis | 330/286 |
| 4,644,301 | 2/1987 | Hecht | 333/101 |
| 4,755,769 | 7/1988 | Katz | 330/295 |
| 4,779,065 | 10/1988 | Katz et al. | 333/101 |
| 4,780,685 | 10/1988 | Ferguson | 330/124 D |
| 4,893,093 | 1/1990 | Cronauer et al. | 330/295 |

OTHER PUBLICATIONS

"Microwave Power Combining Techniques" by Russell, published at pp. 472–478 of IEEE Transactions On Microwave Theory and Techniques, vol. MTT-27, No. 5, May 1979.

"Radial Combiner Runs Circles Around Hybrids" by S. Sanders, published at pp. 55–58 of the Nov., 1980 issue of Microwaves.

"An 8-GHz 8-Way Radial Combiner" by Stones et al., pp. 163–165 of the 1983 IEEE MTT-S Digest.

"60-Way Radial Combiner Uses No Isolators" by Foti et al., published at p. 96 et seq. of the Jul. 1984 Microwaves & RF.

"A 10 Watt Broadband FET Combiner/Amplifier" by Cohn et al., published at pp. 292–297 of the 1979 IEEE MTT-S Symposium Digest.

An undated article "MIC Power Combiners for FET Amplifiers" by Quine et al.

"Resistors Condense Wideband Multiport Signal Splitters" by Tsukii et al. published at p. 197 et seq. in the May, 1988 issue of Microwaves & RF magazine.

Primary Examiner—Steven Mottola
Attorney, Agent, or Firm—William H. Meise

[57] ABSTRACT

A paralleled amplifier arrangement includes a plurality of amplifier modules, the output ports of which are coupled to a common combining node. Switches are coupled to the output ports for selectively decoupling one or more of the amplifier modules from the combining node during those intervals in which the amplifier modules are held in reserve or are nonfunctional. Each amplifier module is associated with an isolation resistor which is coupled to all the isolation resistors. In order to reduce losses attributable to the isolation resistors when the decoupling switches are operated, the isolation resistors are each coupled to a switched network which decouples the isolation resistors associated with the decoupled amplifier modules.

17 Claims, 5 Drawing Sheets

FIG. 4d ptg
PARALLELLED AMPLIFIER WITH SWITCHED ISOLATION RESISTORS

BACKGROUND OF THE INVENTION

This invention relates to composite amplifiers including a plurality of parallelled amplifiers with Wilkinson-type combiners with isolation resistor stars, and particularly to such paralleled amplifiers in which the individual amplifiers or amplifier modules are coupled by switch networks to a combining node.

Many communication systems require transponders separated by significant distances. Such transponders when used for communication links between cities by radiation eliminate the need for land communication cables, which are very costly. The transponders cannot always be placed in the most ideal locations, but rather must be placed at locations where towers or other supports can be placed, and the antennas used with the transponders may be required to have high gain. High gain is achievable with antennas of reasonable size and cost only at microwave frequencies and at frequencies higher than microwave.

The transmission of signal from one transponder to another may require a power amplifier at the transmitting transponder which is capable of generating many watts of power with great reliability. In the past, microwave power was generated by traveling wave tubes (TWT). Traveling wave tubes were used, and continue to be used for microwave transponders notwithstanding the reliability problem attributable to the inherent degradation resulting from operation over a period of time.

More recently, solid state power amplifiers (SSPA) have been used instead of traveling wave tubes at lower microwave frequencies, such as C-band. The SSPA ideally has no inherent degradation mechanism, and is therefore more reliable then the TWT. This reliability is very advantageous, since microwave transponders are often placed at inaccessible locations, as for example at the tops of mountains. Generally speaking, solid state amplifiers are implemented by parallelling a relatively large number of low power solid state devices, amplifiers or amplifier modules. Each amplifier module contributes a portion of the total power output, and power combiners are used to combine the powers from each of the individual amplifier modules to generate the desired amount of sum signal power at the desired microwave or millimeter wave frequencies.

For purposes of reliability, it may be desirable to include within the SSPA one or more backup amplifier modules, which are switched into operation in the event of a failure of one of the other modules. Since some microwave transponders are located in areas far from a power grid, and therefore rely upon solar energy to generate energization voltages, it is important that such backup amplifier modules not be energized during those times when they do not contribute to the sum output power.

Various types of power combiners are described in the article "Microwave Power Techniques" by Kenneth J. Russell, published at pp. 472-478 in the IEEE Transactions On Microwave Theory and Techniques, May 1979. The Russell article describes corporate or tree combiners, in which chains of combinations are performed. Such arrangements tend to be disadvantageous because of the accumulation of losses in the combiners. It is very desirable that the power combination be performed with low loss. U.S. Pat. No. 4,641,106 issued Feb. 3, 1987, to Belohoubek et al. describes a low-loss radial combiner. The structure of radial power combiners is such that implementation of the switching circuits required for connection of redundant modules and disconnection of failed modules may be inconvenient.

U.S. Pat. No. 4,315,222, issued Feb. 9, 1982 to Saleh describes a power combiner arrangement in which the output power from a plurality of amplifier modules is combined at a single junction. Each amplifier module is coupled to the junction by a transmission line having an electrical length of one quarter wavelength ($\lambda/4$) at a frequency within the operating frequency range. The Saleh arrangement has the disadvantage that there is no isolation between the amplifier outputs, so that a change in output level or impedance at the output of a particular amplifier may affect the output power or tuning of the other amplifiers connected to the combining node.

Figure 1:
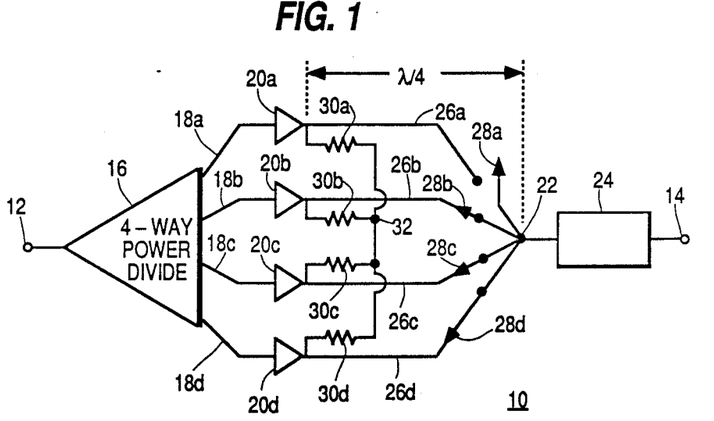
FIG. 1 illustrates a parallelled amplifier arrangement including isolation resistors, in which the isolation resistors undesirably dissipate desired amplified signal.

FIG. 1 illustrates a combined amplifier including an input port 12 and an output port 14. A four-way power divider 16 is connected to input port 12 for receiving signal therefrom and for dividing the received signal into four portions of equal amplitude, which appear on conductors or transmission lines 18a, 18b, 18c and 18d. Each conductor 18a, 18b, 18c and 18d is connected to the input port of an amplifier module 20a, 20b, 20c and 20d, respectively. A combining node 22 is connected by an impedance transformer illustrated as a block 24 to an output port 14. Impedance transformer 24 may, as known, be a transmission line having a length equal to $\lambda/4$ (or odd integer multiples thereof) at a frequency near the center of the operating frequency band.

The output port of each of amplifiers 20a, 20b, 20c and 20d is connected by a length of transmission line 26a, 26b, 26c and 26d, respectively, to a set of single pole, single throw switches 28a, 28b, 28c and 28d, respectively. Switches 28a, 28b, 28c and 28d are connected in common to combining node 22. As illustrated in FIG. 1, switch 28a is nonconductive or open and switches 28b, 28c and 28d are closed or conductive.

With switches 28a, 28b, 28c and 28d in the positions illustrated, power can flow to combining node 22 from the output ports of amplifiers 20b, 20c and 20d. This situation might correspond to one in which amplifier 20a is held in reserve as a redundant amplifier, while amplifier modules 20b, 20c and 20d are on-line providing power to combining node 22 and, by way of impedance transformer 24, to output port 14. Those skilled in the art know that, by appropriate selection of the characteristic impedance of transmission lines 26a, 26b, 26c and 26d, together with selection of the length of each transmission line to be $\lambda/4$ at the center of the operating frequency band, as measured between the output port of each amplifier and combining node 22, a selected impedance may be presented to the output port of each amplifier and to output port 14. Instead of $\lambda/4$, odd integer multiples of $\lambda/4$ may be used. More specifically, proper selection of the lengths and characteristic impedances of the transmission lines can present a 50 ohm or 75 ohm impedance to both output port 14 and to the output ports of amplifiers 20a through 20d.

During those times when any one of amplifiers 20a through 20d is being adjusted or tuned, its output power may change, and/or its output impedance may change. As recommended in the above mentioned Russell article, a resistive star including resistors 30a, 30b, 30c and 30d may be connected between a floating node 32 and the output ports of each of amplifiers 20a through 20d. Those skilled in the art know that, so long as the signals produced at the outputs of amplifiers 20a through 20d are equal in amplitude and in-phase, node 32 will be at the same amplitude and a corresponding phase, so that no voltage appears across any of the resistors and no power is dissipated. However, changes in the output power or output impedance of any one amplifier as might be caused by tuning, degradation or other factors, results in current flow through one or more of the resistors which tends to absorb the incremental change, and thereby cancel the effect of a change at the output ports of the other amplifiers. This may be understood by considering that an increment of signal which might be produced at the output port of amplifier 20d travels to the output ports of amplifiers 20b and 20c by a first path including resistor 30d and resistors 30b and 30c, and also by a second path including transmission lines 26d, 26b and 26c. The path including the transmission lines has a total length of 2x ($\lambda/4$), or $\lambda/2$. The $\lambda/2$ path causes a phase inversion of the signal taking that path relative to the signal arriving by way of the resistors, which results in cancellation of the change as seen at the output ports of the associated amplifiers.

In the structure of FIG. 1, one of switches 28a, 28b, 28c and 28d will always be open, either because the amplifier associated with the open switch is a redundant amplifier awaiting insertion, or because it is associated with a failed amplifier which has been replaced by a redundant amplifier. As known to those skilled in the art, the impedance is zero at a point on a low-loss transmission line which is $\lambda/4$ from an open circuit. Thus, the impedance seen by the output port of amplifier 20a looking into transmission line 26a is a short circuit or at least a very low impedance. Consequently, the end of isolation resistor 30a which is connected to the output port of amplifier 20a is connected at a low impedance point. As a result, the desired signal voltage appears across isolation resistor 30a, and is thereby dissipated as heat rather than being coupled to output port 14. Another way of looking at the cause of the dissipation is that resistor 30a is connected in series with the parallel combination of resistors 30b, 30c and 30d, to form a voltage divider with node 32 at the tap, and the voltage divider is connected across the source of signal. However viewed, the attempt to use isolation resistors in conjunction with a switched arrangement as illustrated in FIG. 1 results in dissipation of the desired amplified signal in the isolation resistors.

Figure 2:
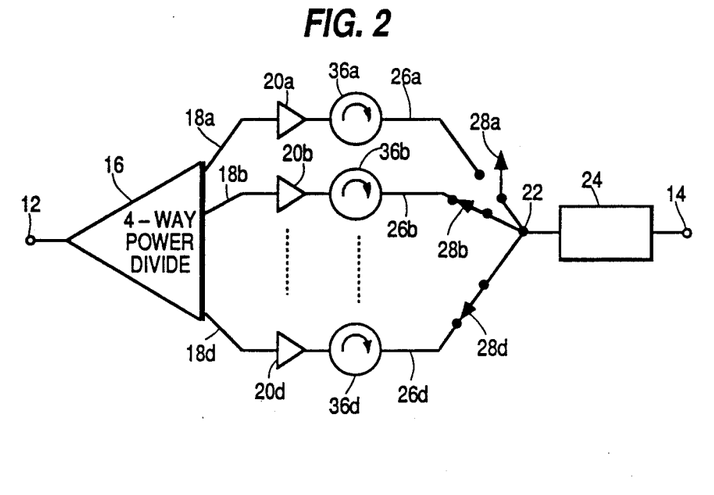
FIG. 2 illustrates a parallelled amplifier arrangement in which isolation is provided by an array of isolators.

FIG. 2 illustrates an arrangement for isolating the outputs of the amplifiers at the outputs of the amplifier modules from the effects of changes in the output signal from other amplifier modules. In FIG. 2, elements corresponding to those of FIG. 1 are designated by the same reference numerals. In FIG. 2, isolation between amplifiers is provided by a plurality of isolators 36a, 36b ... 36d coupled between the outputs of amplifiers 20a, 20b ... 20d, respectively and their output transmission lines 26a, 26b ... 26d. As known, isolators 36a-36d circulate power between their input and output ports and one or more internal loads in such a fashion as to reduce or eliminate interaction between amplifiers. However, such isolators tend to be large, heavy and expensive. An improved arrangement for paralleling amplifier modules is desired in which small, light and low-cost isolation resistors may be used, without dissipating power in the isolation resistors when the amplifier with which they are associated is not contributing to the power combination.

SUMMARY OF THE INVENTION

A parallelled amplifier arrangement for operation at a frequency includes a power combining node and a plurality of amplifier modules, each with an output port at which amplified signal is produced. Each amplifier module is associated with an impedance transformer coupled between its output port and the power combining node. A short-circuiting switch arrangement is coupled to the output port of each of the amplifier modules. A switched isolation arrangement is coupled between the output of each amplifier module and a second node. Each of the switched isolation arrangements includes a series path which extends from the output port of one of the amplifier modules to the second node. The series path includes the cascade of first and second transmission lines with a junction therebetween. Each of the first and second transmission lines has an electrical length which is equal to an odd integer number of quarter wavelengths near the center of a frequency of operation. Each of the switched isolation arrangements further includes a short circuiting switch arrangement coupled to the junction between the first and second transmission lines. Each of the switched isolation arrangements also includes a series resistance associated with the series path. The series resistance dissipates energy associated with unwanted operating modes of the parallelled amplifier modules.

DESCRIPTION OF THE DRAWING

FIG. 4d is a perspective or isometric view of a combining node on the underside of the arrangement of FIG. 4a.

DESCRIPTION OF THE INVENTION

Figure 3:
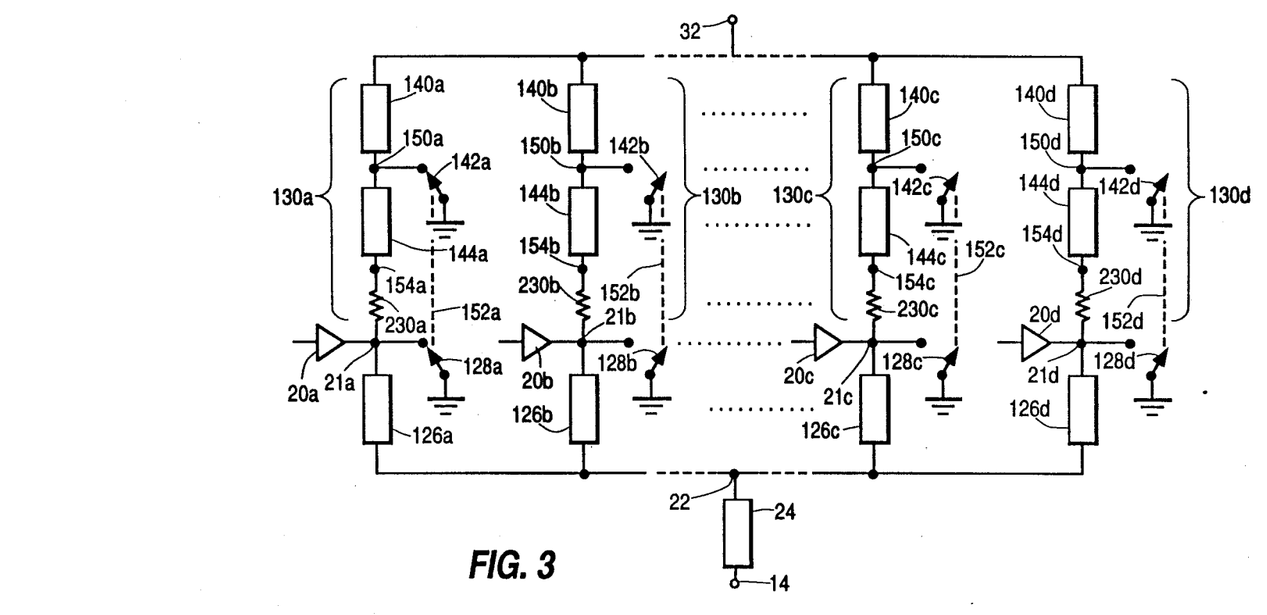
FIG. 3 illustrates a parallelled amplifier arrangement including switched isolation arrangements in accordance with the invention.

FIG. 3 illustrates in schematic form a combined or paralleled amplifier arrangement in accordance with the invention. Elements of FIG. 3 correspond to those of FIGS. 1 and 2 are designated by the same reference numerals In FIG. 3, amplifier modules 20a, 20b ... 20c and 20d receive signal at their input ports from an N-way power divider (not illustrated in FIG. 3). Each amplifier 20a, 20b ... 20c, 20d produces amplified signal at its output port 21a, 21b ... 21c, 21d, respectively, and applies the output signal by way of an impedance transformer 126a, 126b ... 126c, 126d, respectively, to a combining node 22. A further impedance transformer 24 couples combining node 22 to output port 14.

As in the case of FIGS. 1 and 2, impedance transformers 126a, 126b, ... 126c and 126d may each include an unbalanced transmission line having a length of N$\lambda$/4 at a frequency near the center of the operating frequency band, where N is an odd integer. Ordinarily, in order to maximize bandwidth, integer N is unity. The term unbalanced transmission line is well known, and refers to a transmission line such as coaxial line, microstrip line or the like in which the cross-sections of the conductors are not identical, in which the larger may be styled as "ground". Descriptions of such unbalanced transmission lines may refer only to the smaller conductor, the larger being understood.

A short-circuiting switch 128a, 128b . . . 128c, 128d is connected to the output port of each of amplifier modules 20a, 20b. . . 20c, 20d, respectively, for selectively short-circuiting the output ports to ground. Those skilled in the art will recognize that short-circuiting switches 128 connected at the output of the amplifier are equivalent to in-line or series switches 28 connected near node 22 as in FIGS. 1 and 2. During normal operation, amplifier module 20a is held in reserve, and switch 128 is closed to short-circuit the output port of switch 20a. Also under normal operating conditions, amplifier modules 20b, 20c and 20d are on-line and short-circuiting switches 128b, 128c and 128d are open-circuited. In particular, when switch 128a is closed in order to short-circuit the output of amplifier module 20a, the short-circuit presents an open-circuit or very high impedance to combining node 22. This prevents loading of combining node 22 by the redundant amplifier, in the same manner as switch 28a of FIGS. 1 and 2.

Also connected to the output port of each amplifier module 20a, 20b . . . 20c, 20d is an isolation arrangement 130a, 130b . . . 130c, 130d. Isolation arrangement 130a is typical and is described in detail. Isolation arrangement 130a includes the cascade of a first transmission line 140a and a second transmission line 144a, which defines a series path. A first end of transmission line 140a is connected to floating node 32, and the other end of transmission line 140a is connected to one end of transmission line 144a at an intermediate node 150a. Transmission line 140a has a length of N$\lambda$/4, where N is an odd integer which may be unity. Transmission line 144a has a length of N$\lambda$/4, where N is an odd integer which may be unity. A short-circuiting switch 142a controllably connects node 150a to ground. The end of transmission line 144a remote from node 150a is connected by way of a node 154a and an isolation resistor 230a to output port 21a of amplifier module 20a. When switch 142a is open, a series path extends by way of transmission lines 140a and 144a, and by resistor 230a, between floating node 32 and the output port 21a of amplifier module 20a. When switch 142a is closed to short-circuit node 150a to ground, the series path is grounded at a point N$\lambda$/4 from node 32 and from output port 21a of amplifier module 20a. Switch 142a is ganged with switch 128a, as suggested by dash line 152a.

Isolation arrangements 130b, 130c and 130d are similar to 130a. Each includes a series path extending between floating node 32 and the output of its associated amplifier module. The series path includes first and second transmission lines and a resistor having a resistance. A short-circuiting switch is connected to the junction between the first and second transmission lines. Each of the short-circuiting switches is ganged with the associated short-circuiting switch connected to the output port of the associated amplifier module.

In operation, under normal operating conditions in which amplifiers 20b, 20c and 20d are functional, switches 128b, 128c and 128d, together with their associated ganged switches 142b, 142c and 142d, are open-circuited. The corresponding ganged switches 128a and 142a associated with redundant amplifier module 20a are short-circuited. Under this operating condition, the amplified signals produced at the output ports of amplifier modules 20b, 20c and 20d are combined at combining node 22, and the sum signal is transformed to output port 14. Isolation resistors 230b, 230c and 230d are coupled to the output ports of their respective amplifier modules and to the resistors of each of the other active amplifiers by four cascaded lengths of transmission line. More particularly, node 154a, which is connected to one side of isolation resistor 230a, is also connected by way of cascaded transmission lines 144a, 140a, 140b and 144b to node 154b, which is connected to one side of isolation resistor 230b. Similarly, node 154a is connected by way of transmission lines 144a, 140a, 140c and 144c to node 154c, which is connected to one side of isolation resistor 230c. By extension, each node 154 is connected to any other node 154 by a path consisting of four cascaded transmission lines. Each transmission line in a preferred embodiment of the invention has a length of $\lambda$/4, so a cascade of four transmission lines has a total length of $\lambda$.

As is well known to those skilled in the art, a transmission line having length $\lambda$ returns the impedance and phase of signals passing therethrough to the original impedance and phase. Consequently, as to the active amplifier modules 20b, 20c and 20d and their associated isolation resistors 230b, 230c and 20d, it is just as though nodes 154b, 154c and 154d were directly interconnected to form the equivalent of a Wilkinson's resistive star, equivalent to that described in the Russell article, thereby providing the desired isolation among the output ports of the amplifier modules.

On the other hand, the short-circuit provided at output port 21a of amplifier 20a presents an open-circuit by way of $\lambda$/4 transmission line 126a to combining node 22, as mentioned. In addition, short-circuiting switch 122a which short-circuits node 150a to ground, presents a high impedance by way of $\lambda$/4 transmission line 140a to floating node 32, thereby tending to prevent the flow of any signal power into isolation arrangement 130a, and thereby tending to reduce dissipation in resistor 230a. In addition, shorting switch 142a presents a high impedance, by way of $\lambda$/4 transmission line 144a, to node 154a. Since isolation resistor 230a is connected to high impedance node 154a, little residual current tends to flow through resistor 230a, which tends to minimize the power dissipation and resistor 230a.

Insofar as providing isolation during those intervals when amplifier module 20a is on-line is concerned, isolation resistor 230a may be located or connected anywhere along the series path defined by transmission lines 140a and 144a, including the end location illustrated in FIG. 3. For example, resistor 230a could be located somewhere else in transmission line 140a, somewhere in transmission line 144a, or its resistance could be divided among the transmission lines (for this purpose, nodes 150a and 154a are treated as having zero length). When losses occurring in the off-line state are considered, however, certain locations are preferred. When switch 142a short-circuits node 150a to ground, a low impedance point is created. Even small residual signal voltages may result in relatively high signal currents near low impedance points. Therefore, the losses in a series resistor tend to be least at locations N$\lambda$/4 from short-circuits. Such a location for isolation resistor 230a is the location illustrated in FIG. 3, which is separated from node 150a by λ/4. Another corresponding location (not illustrated) for isolation resistor 230a is at the end of transmission line 140a remote from node 150a.

Naturally, no matter which amplifier or module or modules may be inactive due to either failure or to being held in reserve, the same arguments may be made. When any of the switches 128a, 128b ... 128c, 128d and the associated switches 142a, 142b ... 142c, 142d are open, power can flow from the associated output port 21 of the active amplifier modules 20 by way of impedance transformer 126 to combining node 22, and the associated isolation resistors 230 are effectively connected together at their nodes 154. On the other hand, when a pair or pairs of associated switches 128 and 142 are short-circuiting their associated nodes, power cannot reach combining node 22, and a high impedance is presented to nodes 22 to reduce or eliminate interaction. Simultaneously, short-circuited switch(es) 142 decouples the associated isolation resistor(s) 230 from all other isolation resistors, to reduce or eliminate power consumption in that decoupled isolation resistor(s).

Figure 4A:
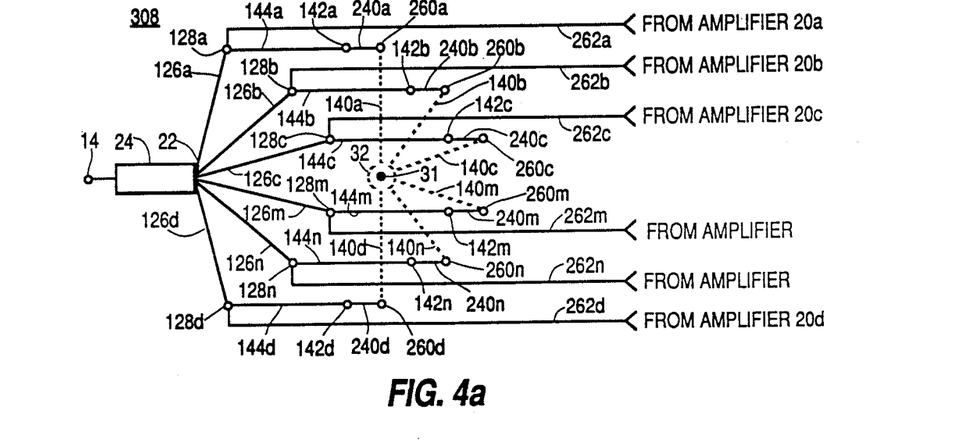
FIG. 4a is a skeletonized diagram of a physical layout on a printed circuit board, corresponding to the arrangement of FIG. 3.

FIG. 4a is a skeletonized diagram illustrating the physical placement of transmission lines and switches on a printed circuit board designated 308, in a particular embodiment of a combiner portion of the invention. In FIG. 4a, elements corresponding to those of FIG. 3 are designated by the same reference numerals.

The combiner illustrated in FIG. 4a is capable of combining the signal from up to six amplifier modules or sources, or a lesser number than six, with the remainder held in reserve. At the left of FIG. 4a, a combining node 22 is connected to an output port 14 by an impedance transformer 24. At the right of FIG. 4a, transmission lines illustrated as lines 262a, 262b, 262c, 262m, 262n and 262d are adapted for receiving signal from associated amplifier modules or sources, and for conveying the signal to short-circuiting switches illustrated as circles 128a, 128b, 128c, 128m, 128n, and 128d, which are arranged along a circular path equidistant from combining node 22. Short-circuiting switches 128a, 128b, 128c, 128m, 128n and 128d are connected to combining node 22 by equal-length transmission lines 126a, 126b, 126c, 126m, 126n and 126d, respectively. From short-circuiting switches 128a, 128b, 128c, 128m, 128n and 128d, further transmission lines 144a, 144b, 144c, 144m, 144n and 144d, respectively, extend parallel to transmission lines 262 to connect with short-circuiting switches 142a, 142b, 142c, 142m, 142n, and 142d.

Short-circuiting switches 142a through 142d are arranged along a portion of a circular path centered on a point 31. As illustrated in FIG. 4a, point 31 is centered within combining node 32, which is on the underside of the printed circuit board, as described below.

From short-circuiting switches 142a, 142b, 142c, 142m, 142n, and 142d illustrated in FIG. 4a, microstrip transmission lines 240a, 240b, 240c, 240m, 240n, 240d lying on the upper surface of the board extend coaxial with microstrip lines 144a, 144b, 144c, 144m, 144n, and 144d, respectively, to printed circuit board feedthroughs 260a, 260b, 260c, 260m, 260n and 260d, respectively. Feedthroughs 260 are described in more detail in conjunction with FIG. 4b. On the underside of the printed circuit board illustrated in FIG. 4a, transmission lines 140a, 140b, 140c, 140m, 140n, and 140d extend from the feedthroughs radially toward combining node 32, and make connection therewith as described in detail in conjunction with FIG. 4d.

Figure 4B:
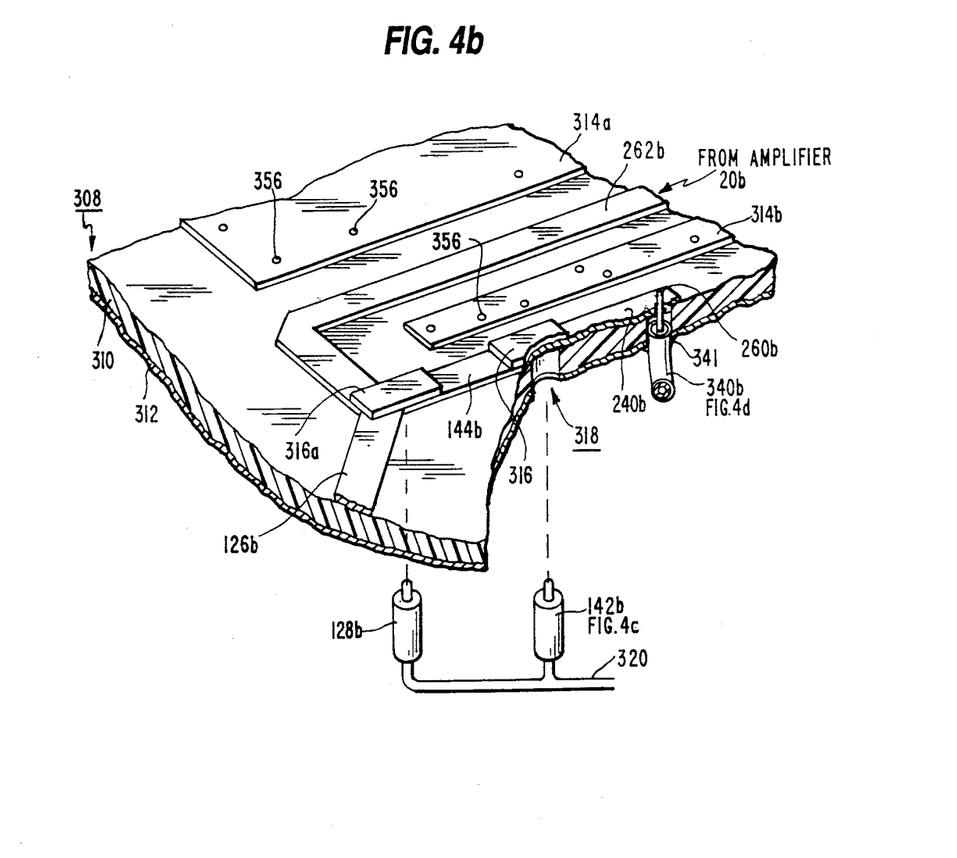
FIG. 4b is a perspective or isometric view of the upper side of, a portion of the printed circuit board of FIG. 4a, exploded and partially cut away to illustrate internal details.

FIG. 4b is a perspective or isometric view of a portion of the combiner structure of FIG. 4a. In FIG. 4b, elements corresponding to those of FIG. 4a are designated by the same reference numerals. In FIG. 4b, printed circuit board 308 includes a nonconductive or dielectric substrate 310, a lower metallization 312 which is principally ground plane, except as described in conjunction with FIG. 4d. Board 308 includes on its upper surface a further metallization defining upper ground plane areas 314a and 314b, and also defining a microstrip transmission line 262b, 126b, 144b and a portion of transmission line 240b.

As illustrated in FIG. 4b, ground planes 314a and 314b include a plurality of holes 356, which are the upper portions of plated-through vias which electrically interconnect upper ground planes 314a and 314b with the ground plane portion of lower metallization 312. Microstrip transmission line 262b extends to an intersection with transmission lines 126b and 144b. Transmission line 144b extends across a through hole 318 to connect with the center conductor 260b of a coaxial cable 340b, the outer conductor of which is soldered to lower metallization 312 at locations such as 341. Connections of this type are notoriously well known in the art and require no further explanation. Also illustrated in FIG. 4b are short-circuiting switches 128b and 142b, which are illustrated as being exploded away from the printed circuit board. Details of short-circuiting switch 142b are illustrated in conjunction with FIG. 4c, and short-circuiting switch 128b is similar.

Figure 4C:
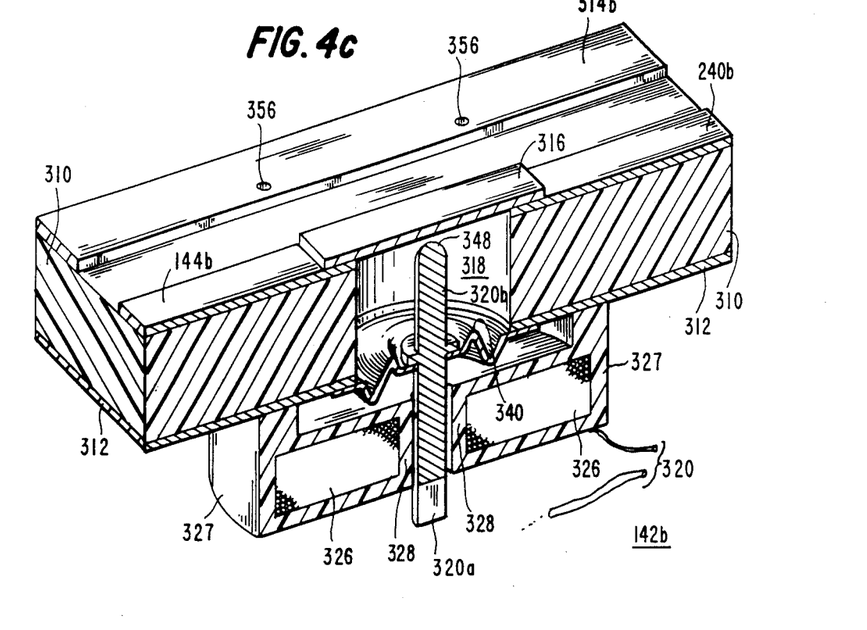
FIG. 4c is a more detailed, cut away perspective or isometric view of a portion of the arrangement of FIG. 4b.

FIG. 4c is a perspective or isometric view of a portion of printed circuit board 308 of FIG. 4b in the vicinity of short-circuiting switch 142b, with the switch assembled to the printed circuit board. In FIG. 4c, elements corresponding to those of FIG. 4b are designated by the same reference numerals. Short-circuiting switch 142b of FIG. 4c includes a nonmagnetic electrically conductive plunger 320b supported by a conductive diaphragm spring 340. The outer edge of diaphragm spring 340 is electrically connected, as by soldering, to lower ground plane 312 around the periphery of hole 318. The natural position of diaphragm spring 340 is selected in conjunction with the projecting length of plunger 320b so that tip 348 of plunger 320b is not in contact with the lower surface of a conductive bridging element 316 which bridges across hole 318 from transmission line 144b to transmission line 240b. An electromagnet illustrated as 326 is supported by a frame 327 adhesively affixed to the lower surface of ground conductor 312, and when energized by conductors 320 attracts a magnetic slug 320a affixed to the lower portion of plunger 320b. When electromagnet 326 is energized, slug 320a is drawn upward, thereby tending to push tip 340a of conductive plunger 320b into contact with the lower surface of bridging conductor 316, to thereby ground the transmission lines. The structure as described is similar to that described in U.S. Pat. No. 4,782,313 issued Nov. 1, 1988 to Brant, except that bridging conductor 316 is immobile and remains at all times in contact with both transmission line 144b and 240b.

Figure 4D:
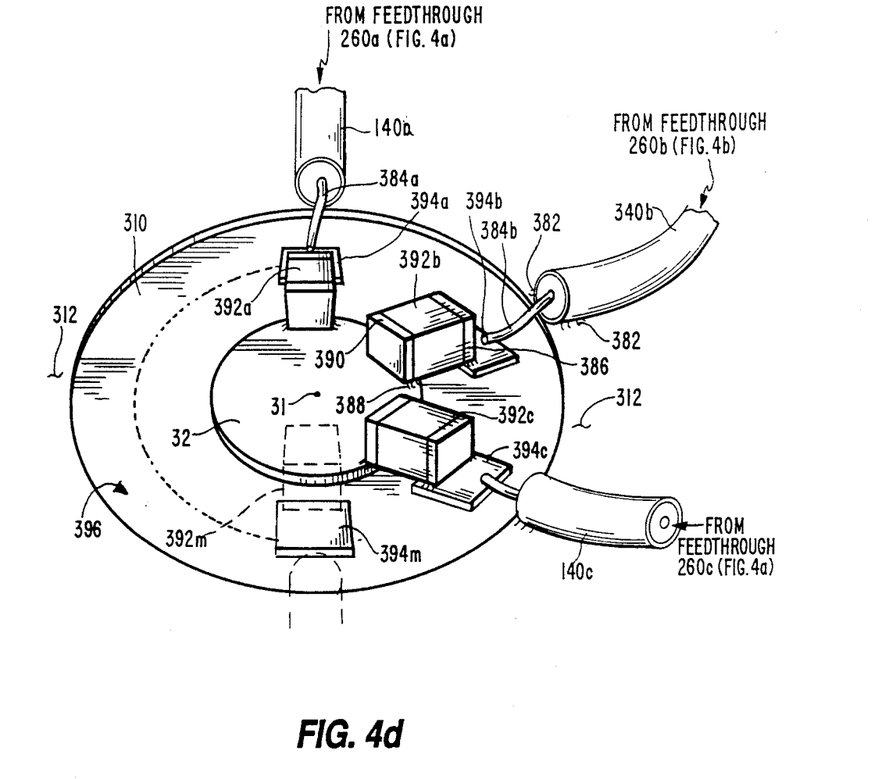

As mentioned in conjunction with FIGS. 4a and 4b, transmission lines in the form of coaxial conductors extend from printed circuit feedthrough points 260 to the region of combining node 32. FIG. 4d illustrates in perspective or isometric view details of combining node 32, which is on the underside of printed circuit 308.

Elements of FIG. 4d corresponding to those of FIGS. 4a and 4d are designated by the same reference numerals. In FIG. 4d, an annular hole 396 within ground conductor 312 defines a further conductive region which is combining node 32 Within annular aperture 396, a group of conductive connection pads 394a, 394b, 394c, 394m . . . provide solder points for interconnection of resistors with transmission lines. The connections are similar, and therefore only the connection of resistor 392b with transmission line 340b will be described in detail.

As illustrated in FIG. 4d, the outer conductor of coaxial transmission line 340b is connected to ground plane 312 by a solder fillet 382. Center conductor 384b of coaxial transmission line 340b extends across a portion of annular aperture or gap 396 and is soldered to solder pad 394b. A rectangular chip resistor designated 392b includes end metallizations 386 and 390. End metallization 386 is soldered to conductive pad 394b, and the body of resistor 392b extends across a portion of aperture or gap 396 so that end metallization 390 is adjacent an edge of combining pad 32. Connection is made between end metallization 390 and combining node 32 by solder fillets 388.

Other embodiments of the invention will be apparent to those skilled in the art. For example, parallelled solid-state amplifier modules have been described, but TWT amplifiers or other types of amplifiers may be parallelled in a similar fashion. Instead of amplifier modules, the power from phase-coherent oscillators may be combined in the same manner. While a single amplifier module has been described as being held in reserve, a plurality may be so held. The ganging of the switches may be accomplished mechanically, by series electrical connection as illustrated, or by separate drive from logic circuits.

What is claimed is:

1. A parallelled amplifier arrangement for operation at a frequency, comprising:
    a first plurality of amplifiers, each including an output port for producing amplified signal at said output port, the amplitudes of said amplified signal at each of said output ports being nominally equal;
    a power combining node;
    a plurality, equal to said first plurality, of first impedance transformers, each of said first impedance transformers being coupled to the output port of one of said amplifiers, all of said first impedance transformers also being coupled to said power combining node, for coupling said amplified signals from said first plurality of amplifiers to be combined at said power combining node;
    a plurality, equal to said first plurality, of controllable first short-circuiting switch means, each of said first short-circuiting switch means being coupled to said output port of one of said amplifiers, for controllably short-circuiting the output port of one or more of said amplifiers;
    a second node;
    a plurality, equal to said first plurality, of switched isolation means, each of said switched isolation means including a series path extending from said output port of one of said amplifiers to said second node, said series path including first and second cascaded transmission lines defining a junction therebetween, each of said first and second transmission lines having a length equal to an odd integer number of quarter wavelengths near the frequency of operation, each of said switched isolation means further including second short-circuiting switch means coupled to said junction between said first and second transmission lines, for short-circuiting said first and second transmission lines at a location remote from said second node and from said output port of the associated amplifier, each of said switched isolation means also including series resistance means associated with said series path, for dissipating energy associated with unwanted operating modes of the parallelled amplifiers arrangement when the second switch means which is associated with said series resistance means is open, said second switch when closed preventing dissipation of power in said series resistance means.

2. An arrangement according to claim 1, wherein said odd integer is one.

3. An arrangement according to claim 1 wherein each of said first impedance transformers comprises a transmission line having a length equal to a second odd integer number of quarter wavelengths at said frequency of operation.

4. An arrangement according to claim 3 wherein said second integer number is one.

5. An arrangement to claim 4 further comprising output impedance transforming means coupled between said power combining node and an output port of said parallelled amplifier arrangement.

6. An arrangement according to claim 5 wherein said output impedance transforming arrangement includes a fourth transmission line having a length equal to a third odd integer number of quarter wavelengths at said frequency of operation.

7. An arrangement of claim 6 wherein said third integer is one.

8. An arrangement according to claim 1 further comprising control means coupled to said first and second short-circuiting switch means for, when said first short-circuiting switch means associated with a particular one of said amplifiers is in one of a closed and an open state, controlling said second short-circuiting switch means associated with said particular one of said amplifiers to a corresponding state.

9. A combiner, comprising:
    a first plurality of receiving nodes adapted for receiving mutually in-phase signals to be combined;
    a combining node;
    means coupled to said combining node and to said first plurality of receiving nodes for coupling said signal from each of said nodes to said combining node with mutually equal phase;
    a plurality, equal to said first plurality, of first short-circuiting switches means, each of said first short-circuiting switch means being coupled to one of said nodes for, when conductive, presenting a low impedance to the associated signal to thereby prevent its combination at said combining node;
    a second node;
    a plurality, equal to said first plurality, of isolation arrangements, each of said isolation arrangements including first and second transmission lines cascaded to define a series path extending between said second node and one of said receiving nodes and to also define an intermediate node lying between said first and second transmission lines, each of said isolation arrangements further including an intermediate short-circuiting switch means coupled to said intermediate node for short-circuiting said first and second transmission lines, said intermediate short-circuiting switch means being ganged with one of said first short-circuiting switch means; and a plurality equal to said first plurality, of resistance means, one of said resistance means being associated with said series path of each of said isolation arrangements 10. A combiner according to claim 9 wherein each of said first transmission lines has a length of $N\lambda/4$, where N is an odd integer.

11. A combiner according to claim 10 when $N=1$.

12. A combiner according to claim 10 wherein each of said second transmission lines has a length of $M\lambda/4$, where M is an odd integer.

13. A combiner according to claim 12 wherein $M=N=1$.

14. A combiner according to claim 9 wherein each of said resistance means comprises a discrete resistor.

15. A combiner according to claim 9 wherein each of said resistance means is located in the associated one of said series paths at a point remote from said intermediate node.

16. A combiner according to claim 15 wherein each of said resistance means is located at a point adjacent said second node.

17. A combiner according to claim 15 wherein each of said resistance means is located at a point adjacent one of said receiving nodes.

* * * * *